(12) United States Patent
Lell et al.

(10) Patent No.: US 8,995,490 B2
(45) Date of Patent: Mar. 31, 2015

(54) EDGE-EMITTING SEMICONDUCTOR LASER DIODE AND METHOD FOR PRODUCING THE SAME

(75) Inventors: Alfred Lell, Maxhuette-Haidhof (DE); Christoph Nelz, Wiesent (DE); Christian Rumbolz, Lappersdorf (DE); Stefan Hartauer, Wolfsegg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 105 days.

(21) Appl. No.: 13/821,186

(22) PCT Filed: Sep. 7, 2011

(86) PCT No.: PCT/EP2011/065477
§ 371 (c)(1),
(2), (4) Date: May 20, 2013

(87) PCT Pub. No.: WO2012/048962
PCT Pub. Date: Apr. 19, 2012

(65) Prior Publication Data
US 2013/0230068 A1    Sep. 5, 2013

(30) Foreign Application Priority Data
Sep. 28, 2010  (DE) .......................... 10 2010 046 793

(51) Int. Cl.
| | |
|---|---|
| H01S 3/14 | (2006.01) |
| H01S 5/00 | (2006.01) |
| H01L 21/00 | (2006.01) |
| H01S 5/22 | (2006.01) |
| H01S 5/223 | (2006.01) |
| H01S 5/042 | (2006.01) |
| H01S 5/40 | (2006.01) |

(52) U.S. Cl.
CPC ............. *H01S 5/2202* (2013.01); *H01S 5/2231* (2013.01); *H01S 5/0425* (2013.01); *H01S 5/2219* (2013.01); *H01S 5/222* (2013.01); *H01S 5/4031* (2013.01); *H01S 2301/176* (2013.01)
USPC ............................. 372/44.01; 372/39; 438/42

(58) Field of Classification Search
CPC ................................. H01S 5/22; H01S 5/2202
USPC ...................................... 372/39, 44.01, 43.01
See application file for complete search history.

(56) References Cited

U.S. PATENT DOCUMENTS

| | | | |
|---|---|---|---|
| 5,070,510 A | 12/1991 | Konushi et al. | |
| 5,208,138 A * | 5/1993 | Lazarus et al. ................ | 430/326 |
| 5,400,354 A | 3/1995 | Ludowise et al. | |
| 5,574,743 A | 11/1996 | van der Poel et al. | |

(Continued)

FOREIGN PATENT DOCUMENTS

| | | |
|---|---|---|
| CN | 1402395 A | 3/2003 |
| DE | 10 2008 015 253 A1 | 9/1990 |

(Continued)

*Primary Examiner* — Armando Rodriguez
(74) *Attorney, Agent, or Firm* — Slater & Matsil, L.L.P.

(57) ABSTRACT

An edge-emitting semiconductor laser diode includes an epitactic semiconductor layer stack and a planarization layer. The semiconductor layer stack includes a main body and a ridge waveguide. The main body includes an active layer for generating electromagnetic radiation. The planarization layer embeds the ridge waveguide such that a surface of the ridge waveguide and a surface of the planarization layer form a flat main surface. A method for producing such a semiconductor laser diode is also disclosed.

19 Claims, 3 Drawing Sheets

(56) References Cited

U.S. PATENT DOCUMENTS

| | | |
|---|---|---|
| 6,503,770 B1 | 1/2003 | Ho et al. |
| 2003/0016712 A1 | 1/2003 | Matsumoto |
| 2008/0049801 A1 | 2/2008 | Eichler et al. |
| 2008/0197377 A1 | 8/2008 | Sudo et al. |
| 2008/0281385 A1* | 11/2008 | Inada et al. .................. 607/94 |
| 2009/0034567 A1 | 2/2009 | Kuramoto et al. |
| 2010/0329297 A1* | 12/2010 | Rumpler et al. .......... 372/50.22 |
| 2011/0051771 A1 | 3/2011 | Avramescu et al. |

FOREIGN PATENT DOCUMENTS

| | | |
|---|---|---|
| DE | 10 2008 019 268 A1 | 9/2009 |
| EP | 0657977 A2 | 6/1995 |
| EP | 1 460 741 A1 | 9/2004 |
| JP | 02-154493 A | 6/1990 |
| JP | 2002-299763 A | 10/2002 |
| WO | 2009093792 A1 | 7/2009 |

* cited by examiner

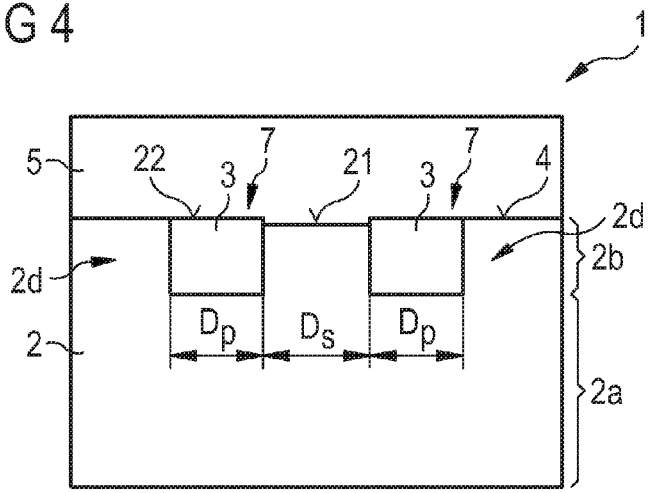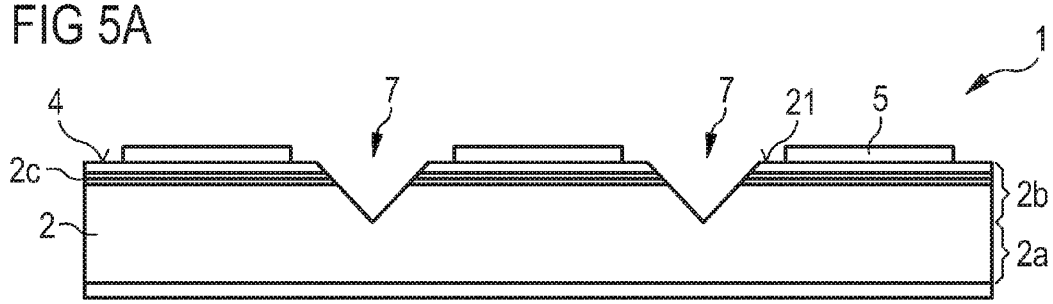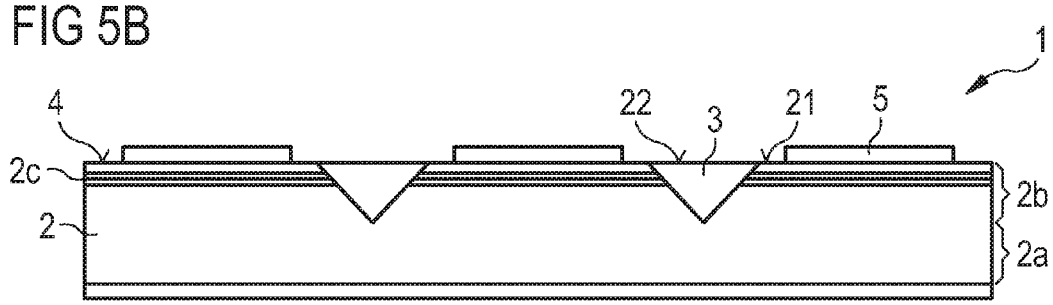

EDGE-EMITTING SEMICONDUCTOR LASER DIODE AND METHOD FOR PRODUCING THE SAME

This patent application is a national phase filing under section 371 of PCT/EP2011/065477, filed Sep. 7, 2011, which claims the priority of German patent application 10 2010 046 793.6, filed Sep. 28, 2010, each of which is incorporated herein by reference in its entirety.

TECHNICAL FIELD

The invention relates to an edge emitting semiconductor laser diode comprising a semiconductor layer stack and a planarization layer and a method for producing the same.

BACKGROUND

A semiconductor laser element is specified in Japanese Patent Publication No. 2002-299763 A.

On account of their compactness and cost-effective production, semiconductor laser diodes are used in numerous areas of application, such as, for example, data transmission, data storage, projection, material processing, optical pumping, biosensor technology and the like. In particular semiconductor laser diodes having a ridge waveguide, so-called ridge laser diodes, are used in this case. Conventional ridge technology is encountering its limits here in the face of constantly increasing requirements regarding higher powers, improved mode behavior and the like, with regard to robustness, reliability and high radiation efficiency. Central problems here are the inadequate mechanical stability, the deficient electrical loading capacity and the unsatisfactory leakage current and aging behavior of the conventional ridge laser diodes. In particular, the manufacturing yield for mass market applications and the production costs associated therewith are not optimal.

FIGS. 6A and 6B illustrate two exemplary embodiments of a conventional ridge waveguide semiconductor laser diode in cross section. On a GaN substrate 100 there are arranged an n-conducting cladding layer 101, an n-conducting waveguide layer 102, an active semiconductor layer 2c, a p-conducting waveguide layer 103, a p-conducting cladding layer 104 and an ohmic contact layer 105. The p-conducting cladding layer 104 and the p-conducting waveguide layer 103 are etched in such a way that a ridge waveguide 200 is formed. The semiconductor laser diode thus has a main body 201 and a ridge waveguide 200.

Side faces of the ridge waveguide and of the main body are provided with a passivation layer 107. In this case, the passivation layer 107 is arranged uniformly on the side faces, such that this is embodied in a stepped fashion. In addition, the passivation layer has an opening on the surface of the ridge waveguide, such that an electrical contact connection is made possible at this surface of the ridge waveguide.

For making electrical contact with the semiconductor laser diode, an n-conducting connection layer 106 is arranged on that side of the substrate which faces away from the semiconductor layers and a p-conducting connection layer 5 is arranged on the passivation layer and the ridge waveguide.

However, laser diodes of this type have a deficient robustness since the ridge waveguide of the laser diode is susceptible to mechanical damage such as, for example, scratching, bond damage or external mechanical force effects. In addition, on account of the vertically formed side face of the ridge waveguide, uniform application of the p-side contact is difficult to carry out since, on account of shading effects, the contact feed at the base of the ridge waveguide is formed in a very thin fashion. However, these thinned contact regions constitute weak points in the current-carrying capacity and can lead to an electrical failure of the semiconductor laser diode. A further problem of the conventional laser diodes is a short-circuit risk. In particular on account of the passivation layer 107 having a thickness of only a few 100 μm, there is the risk of a short circuit in the region of the active layer 2c in the case where the etching process carried out for producing the ridge waveguide is implemented partially deeper, such that etching is effected near or even through the active layer 2c.

SUMMARY OF THE INVENTION

Embodiments of the invention avoid these disadvantages and in so doing providing a semiconductor laser diode which has an improved robustness and electrical stability and, as a result thereof, an increased lifetime. Furthermore, embodiments of the invention specify an improved method for producing a semiconductor laser diode of this type.

The invention provides an edge emitting semiconductor laser diode comprising an epitaxial semiconductor layer stack and a planarization layer. The semiconductor layer stack has a main body and a ridge waveguide, wherein the main body has an active layer for generating electromagnetic radiation. The planarization layer embeds the ridge waveguide in such a way that a surface of the ridge waveguide and a surface of the planarization layer form a planar main face.

The planarization layer thus encloses the ridge waveguide at least in regions and forms a main face terminating the semiconductor laser diode with the ridge waveguide. The main face terminates the semiconductor laser diode externally, in particular toward the top. The main body, the ridge waveguide and the planarization layer preferably form a parallelepiped. Preferably, the ridge waveguide does not project beyond the planarization layer. In particular, the surface of the ridge waveguide and the surface of the planarization layer are arranged flush with respect to one another.

The arrangement of the ridge waveguide in the planarization layer makes it possible to minimize, in particular prevent, mechanical influences at the ridge waveguide and resultant damage to the ridge waveguide. The ridge waveguide is thus protected against mechanical stresses by means of the planarization layer, as a result of which the robustness of laser diodes of this type and the lifetime are advantageously improved.

In addition, the electrical stability is improved on account of the minimized risk of leakage currents, since the planarization layer can be applied uniformly on account of minimized shading effects. In particular, the electrical loading capacity and in addition the short-circuit stability are improved by virtue of the fact that a planarization of the side flanks of the ridge waveguide can be obtained, as a result of which constrictions and shading at said side flanks can be avoided. The electrical loading capacity of the laser diodes can thus be significantly increased.

Advantageously, the planarization layer can be applied on the semiconductor layer stack by deposition methods that are free of negative shading effects. As a result, the planarization layer can efficiently protect against excessive field increases and resultant short circuits. In addition, the planarization layer leads to an increase in the electrical loading capacity in the forward direction and reverse direction and to reduced failure rates. Deposition methods used include, in particular, atomic layer deposition, ion beam deposition, ion platinum deposition, parylene deposition and the like.

Advantageously, the risk of fault sources such as, for example, reverse current failures, contact erosions, device instability and the like can be reduced with laser diodes of this type. In addition, the process for producing laser diodes of this type is advantageously simplified since, for example, sacrificial layer processes, such as are conventionally used during the etching process for producing the ridge waveguide, and an associated subsequent lift-off technique for said sacrificial layer can be dispensed with.

The semiconductor laser diode is an edge emitter which emits radiation in a vertical main radiation direction. By way of example, the semiconductor layer stack is arranged on a substrate, wherein the emission direction of the laser diode is oriented parallel to the base area of the substrate. The laser diode accordingly emits radiation at a side face.

In particular, the edge emitting semiconductor diode has at least two facets at the active layer which form a resonator. In this case, facet should be understood to be a smooth interface. In this case, smooth means that the surface roughness of the facet is significantly less than the wavelength of the light to be generated by the semiconductor laser diode during the operation thereof, preferably less than half of the wavelength, particularly preferably less than one quarter of the wavelength. The facets form interfaces or side faces of the main body of the laser diode. The facets are situated at mutually opposite sides of the main body and thus form an optical resonator. The radiation generated by the active layer is coupled out from the laser diode via one of the facets. Accordingly, radiation is coupled out perpendicularly to said facet.

The active layer of the semiconductor laser diode has a pn junction, a double heterostructure, a single quantum well structure or a multiple quantum well structure (MQW) for generating radiation. In the context of the application, the designation quantum well structure encompasses, in particular, any structure in which charge carriers can experience a quantization of a plurality of energy states as a result of confinement. In particular, the designation quantum well structure does not include any indication about the dimensionality of the quantization. It therefore encompasses, inter alia, quantum wells, quantum wires and quantum dots and any combination of these structures.

The semiconductor layer stack, in particular the active layer, contains at least one III/V semiconductor material, for instance a material from the material systems $In_xGa_yAl_{1-x-y}P$, $In_xGa_yAl_{1-x-y}N$ or $In_xGa_yAl_{1-x-y}As$, in each case where $0 \leq x$, $y \leq 1$ and $x+y \leq 1$. III/V semiconductor materials are particularly suitable for generating radiation in the ultraviolet ($In_xGa_yAl_{1-x-y}N$), through the visible ($In_xGa_yAl_{1-x-y}N$, in particular for blue to green radiation or $In_xGa_yAl_{1-x-y}P$, in particular for yellow to red radiation) to the infrared ($In_xGa_yAl_{1-x-y}As$) spectral range.

In a development of the laser diode, the surface of the ridge waveguide is free of the planarization layer, wherein an electrical connection layer is arranged on the main face. The connection layer can completely cover the main face. Alternatively, the connection layer can be embodied in a structured fashion. Preferably, the electrical connection layer is a p-conducting connection layer which, with an n-conducting connection layer arranged on the opposite side of the semiconductor layer stack relative to the p-conducting connection layer, makes it possible to make electrical contact with the laser diode. The connection layer preferably comprises Pd, Pt, PtPd, PdPt, or Ni.

Since the main face is embodied in a planar fashion, the connection layer can be applied uniformly on the main plane. In particular, it is possible to avoid shading of the connection layer, for example at the side flanks of the ridge waveguide, as a result of which the electrical loading capacity of the laser diodes is significantly increased. In addition, the short-circuit stability is improved as a result. Furthermore, the planarization layer reduces a migration of material of the connection layer, for example a metal migration, and the risk of leakage currents. As a result, the electrical loading capacity in the forward direction and reverse direction is advantageously improved.

In a development, the planarization layer comprises a glass. In particular, the planarization layer is a glass layer, for example composed of spin-on glass, borosilicate glass, phosphosilicate glass or a float glass.

In a development, the planarization layer contains an absorber material. The absorber material is distributed uniformly in the planarization layer.

The absorber material is suitable for at least partly absorbing radiation having a specific wavelength. Higher modes of the laser diode can be absorbed by means of a targeted choice of the absorber material, whereby the fundamental mode of the laser diode is advantageously stabilized. That makes it possible to filter the higher modes, which advantageously leads to higher powers during laser operation in the fundamental mode.

By way of example, Ti, Ge, Si and/or Cr can be used as absorber material.

Alternatively, a glass which has an adjustable absorption effect as a result of thermal baking at temperatures not above the glass point, that is to say an incomplete crystal lattice structure formation, can be used as planarization layer. In particular, the absorber effect can be apportioned by means of the heat treatment conditions such that higher modes are advantageously suppressed, without disadvantageously damping the fundamental mode of the laser.

In a development, a passivation layer is arranged at least in regions between the planarization layer and the semiconductor layer stack. By way of example, the passivation layer is an additional dielectric, for example $Al_2O_3$, $SiO_2$, $SiN$, $ZrO_2$, $TiO_2$, $NbO_2$, $Ta_2O_5$, $TaO_2$, $HfO_2$.

After the ridge waveguide has been produced, the passivation layer is deposited over the whole area onto the semiconductor layer stack. Afterward, the planarization layer is applied to the passivation layer over the whole area. Afterward, the surface of the ridge waveguide is exposed and the connection layer is applied to the main face.

The passivation layer advantageously improves the electrical loading capacity in the forward direction and reverse direction.

In a development, the passivation layer contains an absorber material, with which higher modes can advantageously be filtered, whereby the fundamental mode of the laser is advantageously stabilized. By way of example, the material of the passivation layer itself has absorbent properties. Alternatively, the passivation layer can be made absorbent by means of implantation, diffusion or the like.

In a development, an etching stop layer is arranged at least in regions between the planarization layer and the semiconductor layer stack. In particular, the etching stop layer has a cutout in the region of the surface of the ridge waveguide. The etching stop layer makes it possible to prevent the wet chemical or dry chemical from creeping under.

In a development, the planarization layer has at least two regions arranged one above another, wherein the region adjoining the semiconductor layer stack contains at least one dopant. In particular, the regions of the planarization layer are arranged vertically one above another. Preferably, a material which leads to an opposite doping with respect to the material of the adjoining semiconductor layer is used as the dopant. If the adjoining semiconductor layer is a p-conducting layer, for example, an n-doped alloying substance is used as the dopant, such that a blocking pn junction is formed. As a result, the risk of undesired leakage current paths occurring alongside the ridge waveguide can be minimized or completely avoided.

In a development of the laser diode, semiconductor layers of the semiconductor layer stack are arranged in a manner spaced apart laterally on both sides alongside the ridge waveguide, said semiconductor layers being delimited by trenches, wherein the planarization layer is arranged in the trenches. The planarization layer is thus arranged between the ridge waveguide and the laterally spaced-apart semiconductor layers. The laser diode thus has a double trench structure, wherein the trenches are filled with the planarization layer. Laser structures of this type are also called tripod laser structures. In this case, in particular, the etching process for producing the ridge waveguide is carried out in a strip-shaped fashion, such that semiconductor layers with a corresponding spacing of the width of the trenches and with the same height as the ridge waveguide remain on both sides of the ridge waveguide. Laser structures of this type have the advantage of an improved mechanical robustness with regard to mechanical action, for example scratches.

In a development, the trenches are embodied in a V-shaped fashion, wherein the semiconductor laser diode is a high-power laser. The etched V-trenches can in this case penetrate the active zone and are preferably embodied parallel to the resonator direction. The planarization layer, in particular, is formed over the V-trenches. Ring modes can thus be suppressed by the planarization layer, which preferably comprises an absorber material. As a result, the unprotected pn junctions can be prevented from being short-circuited, as a result of which leakage current paths via the active layer in the V-trench, which paths can arise as a result of migrating ions of the connection layer or solder metallizations, are avoided.

In a method for producing an edge emitting semiconductor laser diode, the following method steps are used. A semiconductor layer stack is etched in such a way that a main body and a ridge waveguide are formed. A planarization layer is applied in such a way that the ridge waveguide is embedded in the planarization layer. A surface of the ridge waveguide is exposed in such a way that a surface of the ridge waveguide and a surface of the planarization layer form a planar main face. An electrical connection layer is arranged on the main face.

Advantageous developments of the method arise analogously to the advantageous developments of the semiconductor laser diode, and vice versa.

In a development, the planarization layer is applied by means of a spin-on process of a liquid suspension. The thickness and homogeneity of the coating can be optimized on the basis of the spin-on conditions in such a way that no or only a very small thickness of less than 100 nm of the planarization layer is applied on the ridge waveguide, while alongside the ridge waveguide the planarization layer advantageously has a thickness of approximately 1000 nm, wherein the thickness of the planarization layer in this region is dependent on the height of the ridge waveguide. In particular, the height of the planarization layer and the height of the ridge waveguide are substantially identical in this region. In this case, substantially means that production-dictated small deviations in height can occur.

In a development, the process of exposing the surface of the ridge waveguide is carried out by a whole-area dry- or wet-chemical etching-back process or a chemical mechanical polishing process. In particular, the exposing process is carried out after a heat treatment step at more than 300° C., preferably 400° C. to 500° C. After the surface of the ridge waveguide has been exposed, the electrical connection layer is subsequently applied.

In a development, before applying the planarization layer, a passivation layer or an etching stop layer is applied to the semiconductor layer stack. In particular, the passivation layer or the etching stop layer is deposited over the whole area onto the semiconductor surface. Afterward, the planarization layer is applied to the passivation layer or etching stop layer by a spin-on process. Afterward, the surface of the ridge waveguide is exposed, wherein the electrical contact-making by means of the connection layer can subsequently be effected.

In a development, the refractive index of the planarization layer is set by means of a heat treatment method, as a result of which the index guiding of the laser diode can advantageously be controlled according to the individual requirement of the respective application. The matching of the refractive index to the diverse application can in this case be effected at the end of the laser diode production process. Thus, at the end of the production process, the laser diode can be set individually in terms of its behavior for damping higher modes. By way of example, in the case of a planarization layer composed of spin-on glass, it is possible to produce a refractive index of 1.3717 by means of a heat treatment method at 400° C., a refractive index of 1.4283 by means of a heat treatment method at 500° C., and a refractive index of 1.4445 by means of a heat treatment method at 600° C.

In a development, at least one dopant is dissolved in the planarization layer, wherein after applying the planarization layer, a heat treatment method is carried out, such that the dopant diffuses in the direction of an interface between planarization layer and semiconductor layer stack. In this case, it is particularly advantageous if a material which leads to an opposite doping with respect to the adjoining semiconductor layer is used as the dopant. The diffusing dopant material produces a blocking boundary layer, whereby an undesired current impression alongside the ridge waveguide is prevented. Undesirable leakage currents alongside the ridge waveguide can thereby be avoided.

In a development of the method, a plurality of laser diodes are produced in a common wafer production method or on a bar plane and are subsequently singulated.

BRIEF DESCRIPTION OF THE DRAWINGS

Further features, advantages, developments and expediencies of the laser diode and the production thereof will become apparent from the exemplary embodiments explained below in conjunction with FIGS. 1 to 5. In the Figures:

FIGS. 1 to 4 in each case show a schematic cross section of an exemplary embodiment of a laser diode according to the invention;

FIGS. 5A and 5B each show a schematic cross section of an exemplary embodiment of a laser diode according to the invention in the production process.

Identical or identically acting constituent parts are in each case provided with the same reference signs. The illustrated constituent parts and the size relationships of the constituent parts among one another should not be regarded as true to scale.

DETAILED DESCRIPTION OF ILLUSTRATIVE EMBODIMENTS

Figure 1:
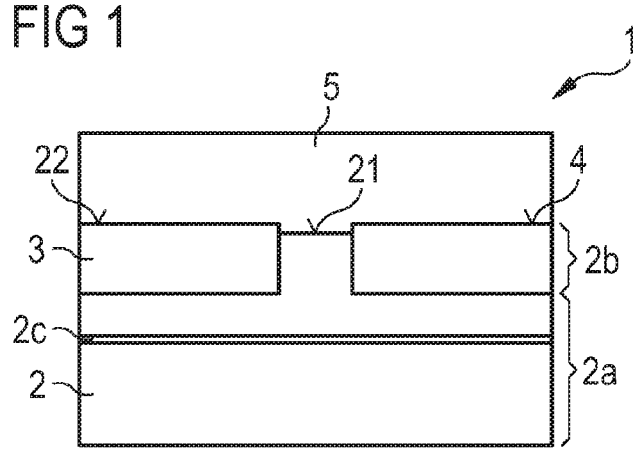

FIG. 1 illustrates a cross section of an edge emitting semiconductor laser diode 1 comprising an epitaxial semiconductor layer stack 2 and a planarization layer 3. The semiconductor layer stack 2 has an active layer 2c for generating electromagnetic radiation. The layer stack 2 can be arranged for example on a substrate or a carrier (not illustrated).

The semiconductor laser diode 1 is an edge emitter. In particular, the semiconductor laser diode 1 has two facets at the active layer 2c which form a resonator. The facets form the interfaces or side faces of the semiconductor laser diode 1. In particular, the facets are situated at mutually opposite sides of the semiconductor layer stack 2. In the present exemplary embodiment, the facets are situated at the side faces of the laser diode parallel to the plane of the drawing. If the semiconductor laser diode is surrounded by air or some other material having a lower optical refractive index than the refractive index of the active layer 2c, then the electromagnetic radiation generated by the active layer 2c can be partly reflected at the facet/air interface. If the two facets are then situated at mutually opposite sides, the two facets form an optical resonator. The electromagnetic radiation generated by the active layer 2c can be coupled out from the semiconductor laser diode 1 via one of the facets.

The active layer 2c of the semiconductor laser diode preferably has a pn junction, a double heterostructure, a single quantum well structure or a multiple quantum well structure for generating radiation. The semiconductor layers of the semiconductor layer stack 2 are preferably based on a phosphide, arsenide, or nitride compound semiconductor. The layers of the layer stack which are arranged below the active layer 2c are n-doped or undoped. The layers of the layer stack 2 which are arranged above the active layer 2c are preferably p-doped or undoped.

The radiation generated by the active layer 2c is coupled out perpendicularly to the facet. In particular, radiation is coupled out perpendicularly to the plane of the drawing or parallel to the epitaxially grown semiconductor layer sequence of the laser diode 1.

The semiconductor layer stack 2 has a main body 2a and a ridge waveguide 2b. Ridge waveguides 2b of this type are also known to the person skilled in the art by the term ridge structure, which will therefore not be explained in any greater detail here. The active layer 2c is arranged in the main body 2a.

The laser diode 1 is thus embodied as a ridge waveguide laser diode, wherein the laser structure is etched such that a strip is formed on the top side, wherein a high degree of index guiding is advantageously present as a result of the jump in refractive index of the laser structure relative to air. As a result, the electrons are laterally restricted, whereby diffusion is avoided.

The ridge waveguide 2b is embedded into the planarization layer 3. The planarization layer 3 is arranged on the semiconductor layer stack in particular at the top side. In this case, a surface 21 of the ridge waveguide 2b and a surface 22 of the planarization layer 3 form a planar main face 4. The surface 21 and the surface 22 are thus arranged flush with respect to one another. In particular, the main face 4 terminates the semiconductor laser diode toward the top. The semiconductor layer stack 2 and the planarization layer 3 intermesh in such a way that overall a parallelepipedal shape is formed.

The ridge waveguide 2b does not project beyond the planarization layer 3 in terms of height. As a result, the ridge waveguide is protected by the planarization layer against mechanical influences and resultant damage. The robustness of laser diodes of this type and the lifetime are thus advantageously improved. Alternatively, slight projection of the ridge waveguide 2b beyond the planarization layer 3 is also possible and likewise affords protection against mechanical influences.

The surface 21 of the ridge waveguide 2b is free of planarization layer 3. In particular, no planarization material is arranged on the surface 21. An electrical connection layer 5 is arranged on the main face 4, said electrical connection layer making electrical contact with the laser diode. The electrical connection layer 5 is preferably a p-conducting electrical connection layer. Arranged on that side of the semiconductor layer stack 2 which faces away from the ridge waveguide 2b there is an n-conducting connection layer (not illustrated) which, together with the p-conducting connection layer 5, makes possible the electrical contact-making.

On account of the planar main face 4, the electrical connection layer can be applied to the semiconductor layer stack uniformly. On account of the planar main face 4, shading effects when applying the connection layer, such as can conventionally occur, can be avoided, which significantly increases the electrical loading capacity of the laser diode. In particular, the electrical stability of laser diodes of this type is increased as a result. Methods used for depositing the connection layer include, in particular, atomic layer deposition, ion beam deposition, ion platinum deposition, parylene deposition, which, in particular, are free of negative shading effects and, as a result, efficiently protect against excessive field increases and resultant short circuits and lead to an increase in the electrical loading capacity in the forward direction and reverse direction and to reduced failure rates as a result of metal migration, for example. In addition, the risk of fault sources with regard to reverse current failures, contact erosions, laser diode stability and the like is reduced. The short circuit risk near the active layer which can occur on account of the etching process of the ridge waveguide 2b is also reduced by the planarization layer 3.

The planarization layer is, for example, a glass layer, in particular comprising spin-on glass, borosilicate glass, phosphosilicate glass or a float glass.

The connection layer 5 preferably contains a metal or a metal alloy, for example Pd, Pt, PtPd, PdPt, Ni.

As planarization layer 3, it is possible to use glasses whose refractive index can be influenced by means of the temperature, as a result of which the index guiding of the laser diode can be controlled according to individual requirements of the respective application. Such matching of the refractive index is advantageously effected at the end of the method for producing the laser diode. As a result, the behavior for damping higher modes of laser diodes of this type can be set individually.

The planarization layer 3 can contain an absorber material. In particular, the material of the planarization layer 3 itself can be absorbent or can be made absorbent by means of implantation or diffusion. In addition, as planarization layer 3 it is possible to use a glass material which acquires an adjustable absorption effect as a result of thermal baking at temperatures not above the glass point, that is to say an incomplete crystal lattice structure formation. In this case, the absorber effect can advantageously be apportioned by means of the heat treatment condition such that the suppression of higher modes can be obtained, without disadvantageously damping the fundamental mode. By way of example, Ti, Ge, Si, Cr is used as absorber material.

As an alternative to the planarization layer 3 comprising absorber material, it is possible to use an additional absorber layer (not illustrated) which filters higher modes and thus allows laser operation in the fundamental mode state up to higher powers.

A laser diode in accordance with exemplary embodiment 1 is produced by the following method steps: providing the semiconductor layer stack 2, etching the semiconductor layer stack 2 in such a way that the main body 2a and the ridge waveguide 2b are formed, applying the planarization layer 3 in such a way that the ridge waveguide 2b is embedded in the planarization layer 3, exposing the surface 21 of the ridge waveguide 2b in such a way that the surface 21 of the ridge waveguide 2b and the surface 22 of the planarization layer 3 form a planar main face 4, and arranging the electrical connection layer 5 on the main face 4.

The planarization layer 3 can be applied for example by a spin-on process in liquid suspension. On the basis of the spin-on condition, in particular a rotational speed variation of preferably between 1000 and 5000 revolutions per minute, the thickness and homogeneity of the coating of the planarization layer 3 can be optimized in such a way that no coating, or only a very small thickness of at most 100 nm of coating, occurs on the ridge waveguide 2b, while the planarization layer alongside the ridge waveguide has a thickness of approximately 1000 nm and is substantially defined by the height of the previously etched step of the ridge waveguide. After a subsequent heat treatment step at temperatures >300° C., preferably in a range of between 400° C. and 500° C., the surface of the ridge waveguide 2b is exposed by whole-area dry- or wet-chemical etching-back of the planarization layer 3. Alternatively, a chemical mechanical polishing method can be used for opening the surface of the ridge waveguide.

After the exposing process, the laser diode 1 can be electrically connected by means of the electrical connection layer 5, for example a metallization layer. After the completion of the laser diode, the refractive index of the planarization layer 3 can be set in accordance with the envisaged application of the laser diode by means of a heat treatment method.

The laser diode of the exemplary embodiment in FIG. 1 has a width in a range of between 100 μm and 400 μm inclusive and a depth in a range of between 300 μm and 600 μm inclusive. The ridge waveguide has a width of approximately 2 μm.

Figure 2:
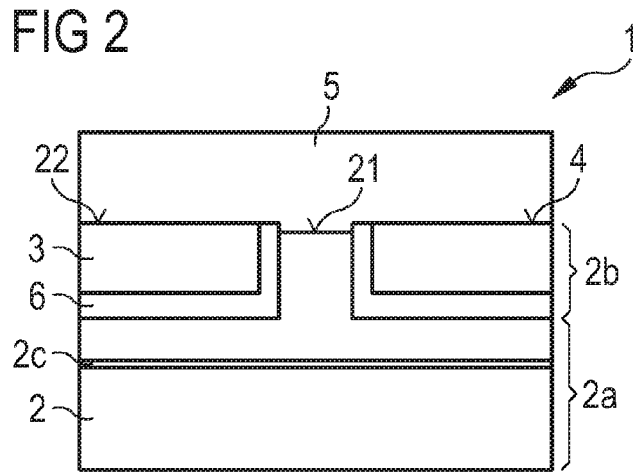

The exemplary embodiment in FIG. 2 differs from the exemplary embodiment in FIG. 1 in that a passivation layer 6 is arranged in regions between the planarization layer 3 and the semiconductor layer stack 2. No passivation layer 6 is arranged on the surface of the ridge waveguide 2b. The passivation layer 6 extends, in particular, at the top side of the semiconductor layer stack 2 and along the side faces of the ridge waveguide 2b, wherein a cutout is arranged on the surface of the ridge waveguide 2b. The passivation layer 6 has a thickness of a few 100 μm, for example. In particular, the passivation layer 6 is embodied in an L-shaped fashion on both sides of the ridge waveguide.

The passivation layer 6 is preferably composed of an electrically insulating material, for example a dielectric material. By way of example, the passivation layer 6 contains $Al_2O_3$, $SiO_2$, SiN, $ZrO_2$, $TiO_2$, $NbO_2$, $Ta_2O_5$, $TaO_2$, $HfO_2$. The passivation layer 6 preferably has a high density and is applied for example by means of an atomic layer deposition, ion beam deposition, ion platinum deposition or parylene deposition.

The planarization layer 6 can contain an absorber material, for example Ti, Ge, Si or Cr. It is thus possible to filter higher modes in laser operation, the fundamental mode of the laser not being disadvantageously damped.

Optionally with respect to the layer assembly comprising planarization layer and passivation layer, further additional layers can be used (not illustrated). By way of example, parylenes or dielectrics deposited by means of atomic layer deposition below and/or above the passivation layer 6 can serve to improve the short-circuit behavior of the laser diode.

In the production method, the exemplary embodiment in FIG. 2 differs from the exemplary embodiment in FIG. 1 in that after etching the semiconductor layer stack 2, firstly the passivation layer 6 is deposited over the whole area onto the semiconductor layer stack 2. Afterward, the planarization layer 3 is applied above the passivation layer 6 by a spin-on process. Afterward, the surface of the ridge waveguide is exposed, in particular the planarization layer and the passivation layer are removed in the region of the surface 21 of the ridge waveguide 2b.

The passivation layer 6 can alternatively be an etching stop layer that serves to prevent the wet chemical from creeping under. The etching stop layer is applied for example by means of a thin-film encapsulation.

For the rest, the exemplary embodiment in FIG. 2 substantially corresponds to the exemplary embodiment in FIG. 1.

Figure 3:
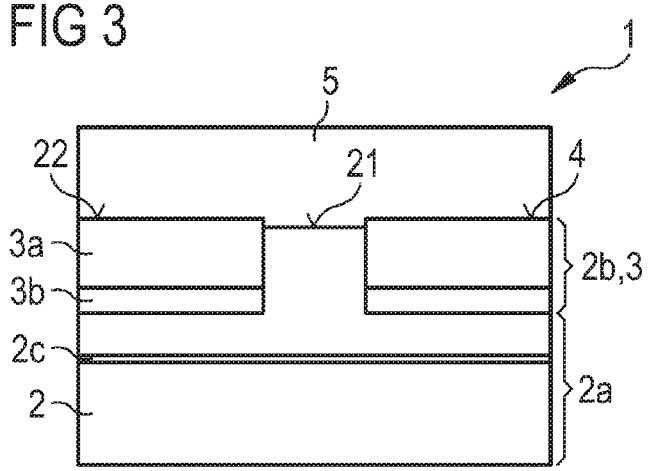
Figure 6A:
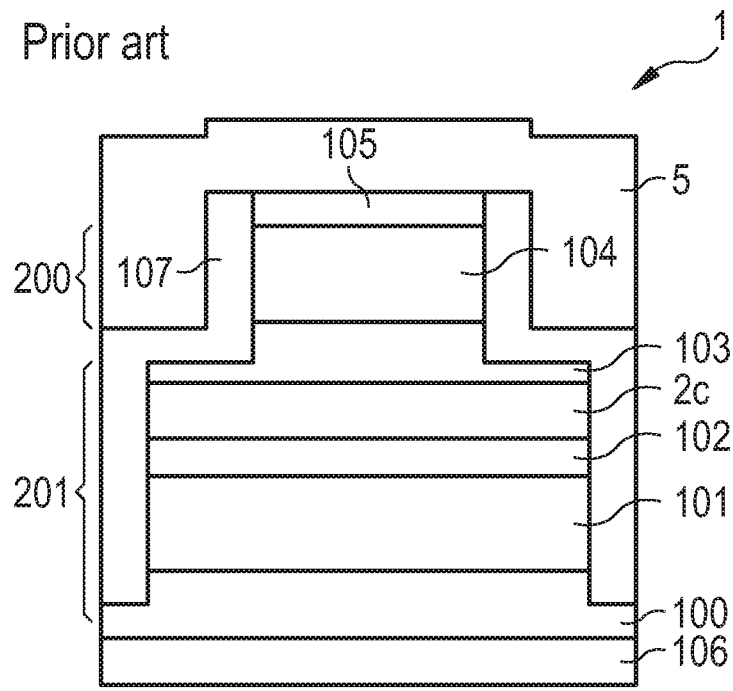
FIGS. 6A and 6B in each case show a schematic view of an exemplary embodiment of a laser diode according to the prior art.
Figure 6B:
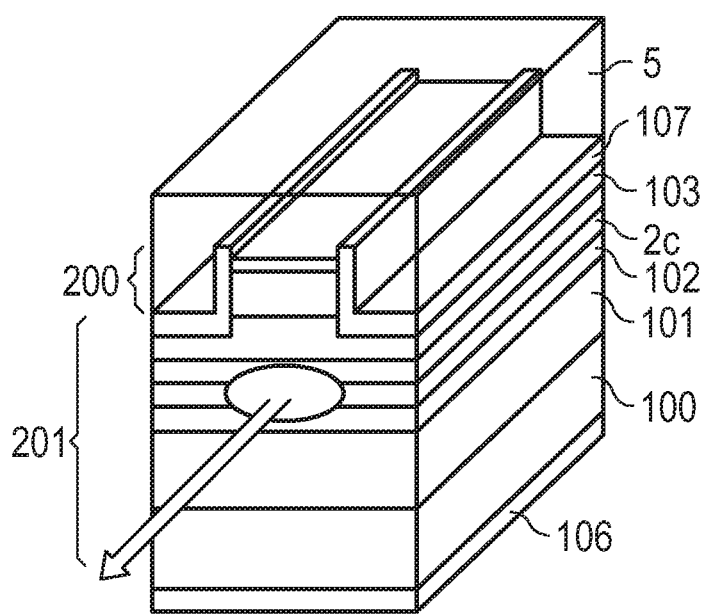

The exemplary embodiment in FIG. 3 differs from the exemplary embodiment in FIG. 1 in that the planarization layer 3 has two regions 3a, 3b arranged one above the other. In particular, the region 3b of the planarization layer 3 which adjoins the semiconductor layer stack 2 comprises at least one dopant. The region 3b is accordingly a doped region. A material which leads to an opposite doping with respect to the adjoining semiconductor layer is used as the dopant of the doped region 3b. As a result, a blocking boundary layer can be produced, as a result of which an undesired current impression alongside the ridge waveguide can be efficiently prevented. If the adjoining semiconductor layer is embodied in a p-conducting fashion, for example, introduction of n-doped alloying substance into the planarization layer 3 by heat treatment can have the effect that a blocking pn junction alongside the ridge waveguide 2b prevents undesirable leakage currents.

In order to produce a two-part planarization layer 3 embodied in this way, in the production method at least one dopant is dissolved in the planarization layer 3, wherein a heat treatment method is carried out after applying the planarization layer 3 on the semiconductor layer stack 2, such that the dopant diffuses to the interface between the planarization layer 3 and the semiconductor layer stack 2, and is taken up in the region 3b.

For the rest, the exemplary embodiment in FIG. 3 substantially corresponds to the exemplary embodiment in FIG. 1.

In the exemplary embodiment in FIG. 4, in comparison with the exemplary embodiment in FIG. 1, a laser diode is presented in which semiconductor layers 2d of the semiconductor layer stack 2 are arranged in a manner spaced apart laterally on both sides alongside the ridge waveguide 2b, said semiconductor layers being delimited by trenches 7, wherein the planarization layer 3 is arranged in the trenches 7. The planarization layer 3 is accordingly arranged between the ridge waveguide 2b and the laterally spaced-apart semiconductor layers 2d. Such a double trench structure is particularly suitable for filling by means of the planarization layer 3.

Laser diodes of this type are also known to the person skilled in the art by the term tripod laser diodes. In this case, in the production process, a ridge waveguide is etched into the semiconductor layer stack, wherein the semiconductor etching is only effected in a strip-shaped fashion, such that semiconductor material of the layer stack remains on both sides of the ridge waveguide with the same height as the ridge waveguide. A laser diode structure of this type is distinguished by an improved mechanical robustness in particular with regard to mechanical influences, for example scratches.

In this exemplary embodiment, the ridge waveguide has a width $D_s$ of between 1 µm and 8 µm. The trenches each have a width $D_P$ of between 50 µm and 30 µm.

For the rest, the exemplary embodiment in FIG. 4 substantially corresponds to the exemplary embodiment in FIG. 1.

The exemplary embodiments in FIGS. 5A and 5B differ from the exemplary embodiment in FIG. 1 in that the laser diode is a high-power laser. As in the exemplary embodiment in FIG. 1, the high-power laser has a semiconductor layer stack 2 which has an active layer 2c and is subdivided into a main body 2a and a ridge waveguide 2b. In contrast to the exemplary embodiment in FIG. 1, trenches 7 are formed which, on the top side of the laser, lead in the direction of the underside and in the process penetrate through the active layer 2c. The trenches 7 are embodied in a V-shaped fashion and divide the high-power laser into a plurality of emitting regions.

As illustrated in FIG. 5B, a respective planarization layer 3 is introduced into the V-shaped trenches 7 and fills the trenches in such a way that a planar main face 4 is produced. The planarization layer 3 comprises an absorber material. Ring modes can be suppressed by the planarization layer 3 comprising absorber material. In addition, the otherwise unprotected active layer can be prevented from being short-circuited thereby avoiding leakage current paths via the active layer in the V-trench, such as can occur for example as a result of migrating p-metallization or solder metallization of the connection layer.

In contrast to the exemplary embodiment in FIG. 1, a structured electrical connection layer 5 is used, wherein a respective structure is arranged on an emitting region of the semiconductor layer stack 2.

For the rest, the exemplary embodiment in FIGS. 5A and 5B corresponds to the exemplary embodiment in FIG. 1.

The invention is not restricted to the exemplary embodiments by the description on the basis of said exemplary embodiments, but rather encompasses any novel feature and also any combination of features, which in particular includes any combination of features in the patent claims, even if this feature or this combination itself is not explicitly specified in the patent claims or exemplary embodiments.

The invention claimed is:

1. An edge emitting semiconductor laser diode comprising:
   an epitaxial semiconductor layer stack having a main body and a ridge waveguide, wherein the main body has an active layer configured to generate electromagnetic radiation; and
   a planarization layer, wherein the planarization layer embeds the ridge waveguide in such a way that a surface of the ridge waveguide and a surface of the planarization layer form a planar main face, wherein the planarization layer has a plurality of regions arranged one above another, and wherein the region of the planarization layer that adjoins the semiconductor layer stack contains a dopant.

2. The semiconductor laser diode according to claim 1, wherein the planarization layer contains an absorber material.

3. The semiconductor laser diode according to claim 1, further comprising a passivation layer arranged between the planarization layer and the semiconductor layer stack.

4. The semiconductor laser diode according to claim 1, wherein the surface of the ridge waveguide is free of the planarization layer.

5. The semiconductor laser diode according to claim 4, further comprising an electrical connection layer is arranged on the main face.

6. The semiconductor laser diode according to claim 1, wherein the planarization layer comprises a glass.

7. The semiconductor laser diode according to claim 1, wherein the planarization layer comprises a glass selected from the group consisting of spin-on glass, borosilicate glass, phosphosilicate glass or a float glass.

8. The semiconductor laser diode according to claim 1, wherein
   semiconductor layers of the semiconductor layer stack are arranged in a manner spaced apart laterally on both sides alongside the ridge waveguide, the semiconductor layers being delimited by trenches; and
   the planarization layer is arranged in the trenches.

9. The semiconductor laser diode according to claim 8, wherein the trenches are embodied in a V-shaped fashion and the semiconductor laser diode is a high-power laser.

10. A method for producing an edge emitting semiconductor laser diode, the method comprising:
    providing a semiconductor layer stack;
    etching the semiconductor layer stack in such a way that a main body and a ridge waveguide are formed;
    applying a planarization layer in such a way that the ridge waveguide is embedded in the planarization layer, wherein a dopant is dissolved in the planarization layer;
    after applying the planarization layer, carrying out a heat treatment method in such a way that the dopant diffuses in the direction of an interface between the planarization layer and the semiconductor layer stack;
    exposing a surface of the ridge waveguide in such a way that a surface of the ridge waveguide and a surface of the planarization layer form a planar main face; and
    arranging an electrical connection layer on the main face.

11. The method according to claim 10, wherein the planarization layer is applied by a spin-on process of a liquid suspension.

12. The method according to claim 10, wherein the exposing is carried out by a whole-area dry- or wet-chemical etching-back process or a chemical mechanical polishing process.

13. The method according to claim 10, further comprising, before applying the planarization layer, applying a passivation layer or an etching stop layer to the semiconductor layer stack.

14. The method according to claim 10, wherein the refractive index of the planarization layer is set by a heat treatment method.

15. The method according to claim 10, wherein providing the semiconductor layer stack comprises providing an epitaxial layer stack.

16. The method according to claim 10, wherein the main body having an active layer configured to generate electromagnetic radiation.

17. An edge emitting semiconductor laser diode comprising:
    an epitaxial semiconductor layer stack having a main body and a ridge waveguide, wherein the main body has an active layer configured to generate electromagnetic radiation, wherein semiconductor layers of the semiconductor layer stack are arranged in a manner spaced apart laterally on both sides alongside the ridge waveguide, the semiconductor layers being delimited by trenches; and
    a planarization layer, wherein the planarization layer embeds the ridge waveguide in such a way that a surface of the ridge waveguide and a surface of the planarization layer form a planar main face, wherein the planarization layer is arranged in the trenches.

18. The semiconductor laser diode according to claim 17, wherein the trenches are embodied in a V-shaped fashion.

19. The semiconductor laser diode according to claim 17, wherein the semiconductor laser diode is a high-power laser.

* * * * *